United States Patent [19]

Pawlakowitsch et al.

[11] Patent Number: 5,228,917
[45] Date of Patent: Jul. 20, 1993

[54] APPARATUS TO REDUCE THE SAGGING OF THE OUTSIDE WALLS OF VACUUM TANKS

[75] Inventors: Anton Pawlakowitsch, Mömbris; Bernhard Schönherr, Offenbach am Main, both of Fed. Rep. of Germany

[73] Assignee: Leybold Aktiengesellschaft, Hanau I, Fed. Rep. of Germany

[21] Appl. No.: 798,631

[22] Filed: Nov. 26, 1991

[30] Foreign Application Priority Data

Sep. 27, 1991 [DE] Fed. Rep. of Germany ....... 4132204

[51] Int. Cl.⁵ .............................................. C23C 14/00
[52] U.S. Cl. ........................................ 118/50; 118/733
[58] Field of Search ................... 118/50, 733; 427/81, 427/294

[56] References Cited

U.S. PATENT DOCUMENTS

| | | | |
|---|---|---|---|
| 2,989,026 | 6/1961 | Gardner et al. | 118/733 X |
| 3,560,166 | 2/1971 | Walles | 118/733 X |
| 5,085,887 | 2/1992 | Adams | 118/733 X |

Primary Examiner—William A. Powell
Attorney, Agent, or Firm—Felfe & Lynch

[57] ABSTRACT

Apparatus for reducing the sagging of essentially planar outside walls (3, 13) on a vacuum tank (1) under operating conditions, and for preventing displacements, resulting therefrom, of components fastened to these outside walls (3, 13), such as rollers (7, 8) of a winding apparatus (2) which is movable with respect to the vacuum tank (1) in a vacuum tape coating apparatus, wherein spacers (12, 14) are provided between two opposite outside walls (3, 13).

12 Claims, 2 Drawing Sheets

PRIOR ART

APPARATUS TO REDUCE THE SAGGING OF THE OUTSIDE WALLS OF VACUUM TANKS

BACKGROUND OF THE INVENTION

The invention relates to an apparatus to reduce the sagging of essentially planar outside walls of vacuum tanks, especially on vacuum tape coating installations, and to prevent the resultant displacement of components fastened to these outside walls, such as the rollers of a winding system.

In vacuum tanks there is generally a danger of the deformation and especially of the sagging in of the tank walls due to the great difference in the pressure on the two sides of the outside walls. This is true of all tanks of all sizes and geometric shapes. In a great number of vacuum tanks, deformation of the kind described above is of minor importance and can be tolerated.

However, there are applications, such as the vacuum coating of tapes, in which the sagging in of the tanks is undesirable or unacceptable. Tape coating apparatus include, as a rule, a stationary vacuum tank with a movable outer wall—the so-called receptacle plate. On this plate there is fastened a winding system for carrying the tape that is to be coated. This winding system includes a plurality of rollers disposed parallel to one another and journaled between the tank plate and a back plate. On account of the extremely slight thickness of the tape or film to be coated and the high speed with which the film runs in the apparatus, the requirements as to the parallelism of the rollers are very great. Even a slight misalignment renders the film unusable.

During the coating operation, i.e., when a vacuum prevails in the tank, the atmospheric pressure against the outer side of the receptacle plate causes the tank plate to sag inward. Since the back plate is largely free of external forces, the rollers get out of parallel to a degree depending on their shape and on how they are mounted.

These undesirable departures from the parallelism of the rollers can be countered by a more complex construction of the rollers. For example, the axles of the rollers are made to run all the way through, which creates the possibility of providing a loose bearing seat at the receptacle plate end to isolate it largely from the movement of the wall. A disadvantage in this case is the greater use of material as well as the low natural frequency of flexural vibrations of the long axle.

Another possibility for reducing o preventing the receptacle plate from sagging is to provide flexurally stiff structural members on the outside of the plate as reinforcement. This, however, has considerable disadvantages as regards production, so that the manufacture of such receptacle plates is more complex and thus more expensive than that of plain plates.

The present invention, then, is addressed to the problem of creating an apparatus which will reduce the sagging in of essentially planar outside walls on vacuum tanks, prevent resultant displacements of rollers, and will be simpler and less expensive to make than apparatus known heretofore.

This problem is solved according to the invention by placing, for example, a spacer rod between the outer walls of the vacuum chamber, if possible in the center of the receptacle plate. It will be set at a minimal distance from the back wall.

Upon the evacuation of the vacuum tank, the forces on the back wall and the receptacle plate will counteract one another through this prop and thus advantageously reduce the sagging.

In a mathematical model, the result was a reduction of the maximum sag from 4 mm, for example, to 0.4 mm, which advantageously results in a 90% reduction of the sagging of the receptacle plate.

Problems with the sagging of outer walls of vacuum tanks of all kinds can basically be reduced in this manner.

SUMMARY OF THE INVENTION

In accordance with the invention, vacuum tape coating apparatus comprises a vacuum tank having essentially planar outside walls which tend to sag under operating conditions and with consequent displacements of components fastened on these outside walls comprising apparatus that is movable with respect to the vacuum tank, and at least one spacer between two opposite outside walls.

For a better understanding of the invention, together with other and further objects thereof, reference is made to the following description, taken in connection with the accompanying drawings, and its scope will be pointed out in the appended claims.

BRIEF DESCRIPTION OF THE DRAWINGS

The invention admits of various possibilities of embodiment; two of them are depicted by way of example in the appended drawings, wherein.

DESCRIPTION OF PREFERRED EMBODIMENTS

Figure 1:
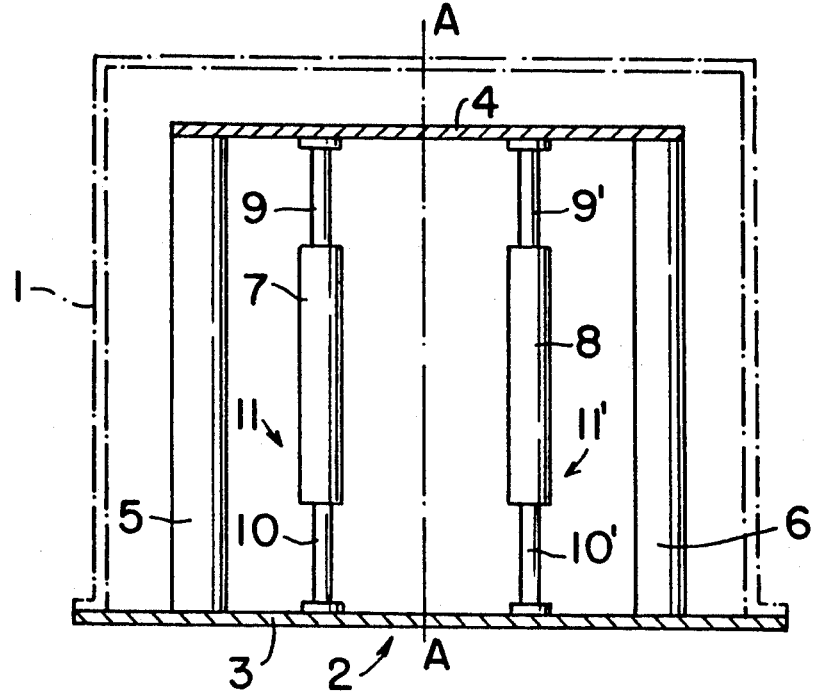
FIG. 1 is a sectional view of a winding system for vacuum tape coating apparatus according to the state of the art.

The broken lines in FIG. 1 identify a stationary vacuum tank 1, the solid lines identify the movable part of a winding system 2. The latter includes in detail a receptacle plate 3, which closes the vacuum tank 1, and a back plate 4 disposed parallel thereto. The plates 3 and 4 are joined to one another by means of the two spacer rods 5 and 6, rods 5 and 6 being at the greatest possible distance from one another radially. Between plates 3 and 4 the rollers 7 and 8 are oriented parallel to the rods 5 and 6. They are each made essentially of three parts, namely two short journal stubs 9, 9', 10, 10', which are joined directly to the plates 3 and 4 and to the actual roller bodies 11 and 11', which are disposed each between a pair of journal stubs 9, 9', 10, 10'. The tank 1 and the winding system 2 are disposed in symmetry with the axis A—A.

Figure 2:
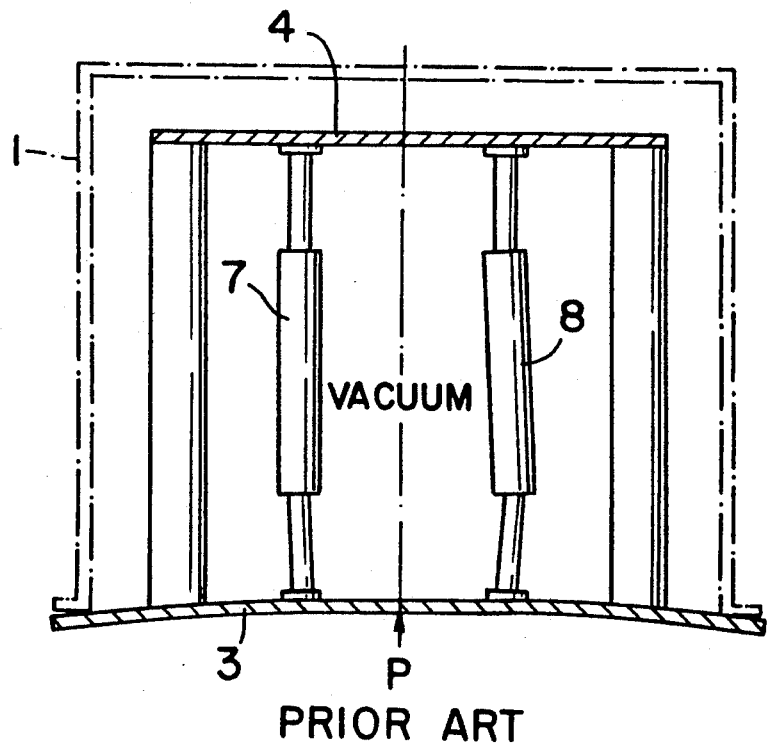
FIG. 2 is a sectional view of a winding system according to FIG. 1 under working conditions.

Under working conditions (FIG. 2) the tank 1 is evacuated and atmospheric pressure P presses against the outside of the tank 1 and of the receptacle plate 3. The result is that the receptacle plate 3 sags concavely toward the interior of the tank 1. Since the back plate 4 is largely free of external forces, displacements of the components fastened to plate 3 are the result, i.e., the rollers 7 and 8 flex, spoiling the parallelism of the rollers 7 and 8 to each other.

Figure 3:
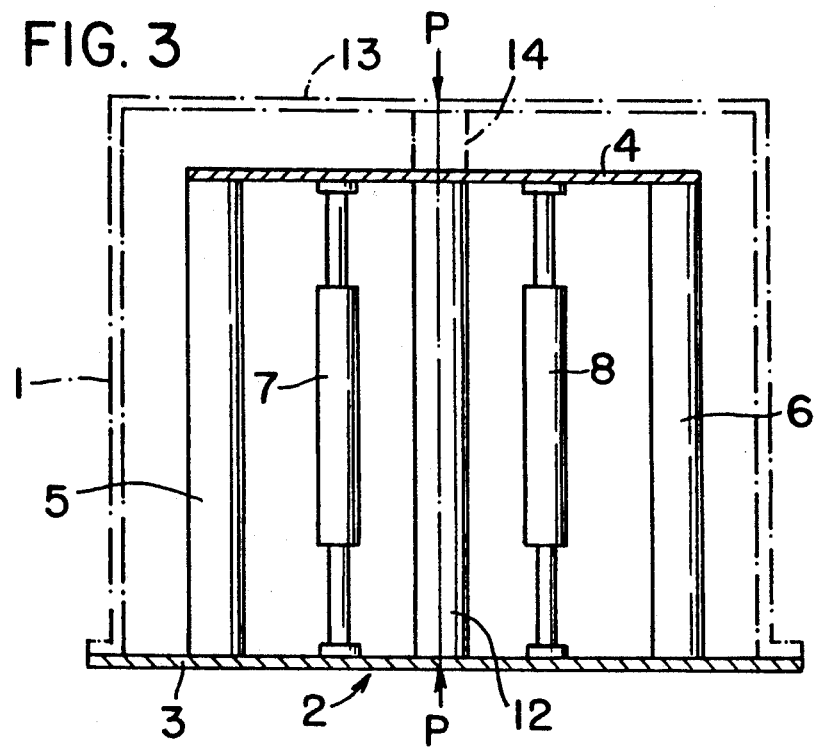
FIG. 3 is a sectional view of a winding system with a prop according to the invention.

FIG. 3 is generally similar to FIG. 1, but in accordance with the invention it is supplemented by a spacer rod 12 which is disposed between the receptacle plate 3 and the back plate 4 in the center of the receptacle plate 3 and parallel to the rods 5 and 6. In axial prolongation of the spacer rod 12, a compression rod 14 is provided between the back plate 4 and the back wall 13 of the vacuum tank 1, being affixed to the said back wall 13. It is set at a minimal distance from the back of the back plate 4, so that, when the tank 1 is evacuated, the forces applied by atmospheric pressure P to the receptacle plate 3 and to the back wall 13 counteract one another and thus reduce the sagging.

Figure 4:
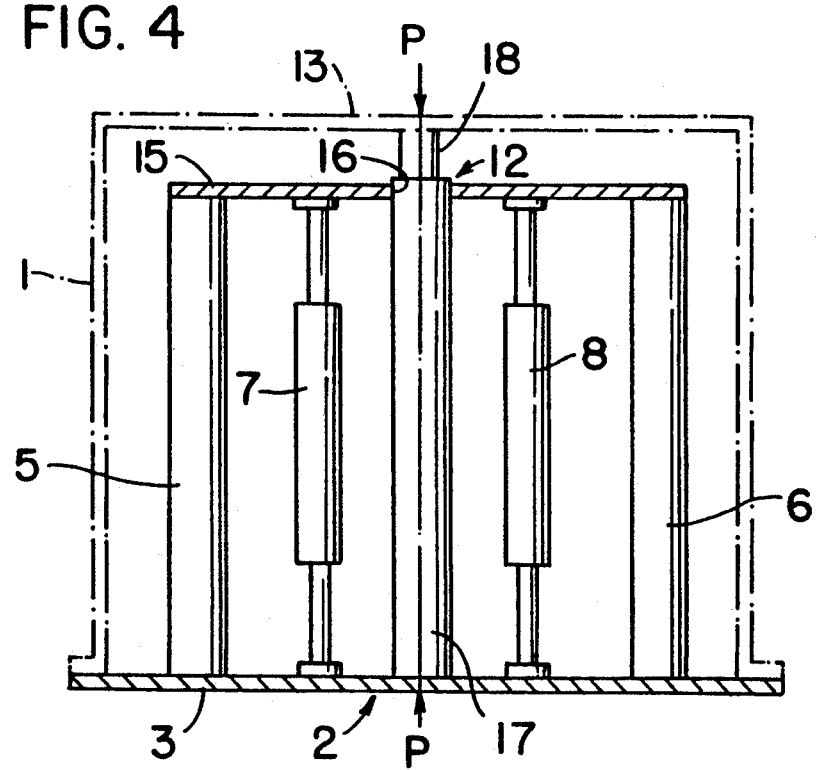
FIG. 4 is a sectional view of a winding system with a spacer adjustable lengthwise.

In FIG. 4 is shown an embodiment alternative to FIG. 3. Instead of a spacer rod and compression rod thrusting against a back plate, a back plate 15 is provided with a bore 16 through which a spacer rod 17 is passed. This rod 17 is provided on one end with a longitudinally displaceable compression piston 18, so that the rod 17 and the piston 18 are in direct contact with one another between the two outside walls 3 and 13.

While there have been described what are at present considered to be the preferred embodiments of this invention, it will be obvious to those skilled in the art that various changes and modifications may be made therein without departing from the invention, and it is, therefore, aimed to cover all such changes and modifications as fall within the true spirit and scope of the invention.

What is claimed is:

1. Vacuum tape coating apparatus comprising:
   a vacuum tank having essentially planar outside walls which tend to sag under operating conditions and with consequent displacements of components fastened on these outside walls, comprising:
   apparatus that is movable with respect to the vacuum tank, and at least one spacer between two opposite outside walls.

2. Apparatus according to claim 1, in which the spacer is a spacer rod.

3. Apparatus according to claim 1, in which said fastened components comprise rollers and in which the movable apparatus has a back plate which is disposed parallel to the two outside walls and between the latter, and against which the rollers thrust.

4. Apparatus according to claim 3, in which a spacer rod is disposed between the outside wall and the opposite back plate of the movable apparatus.

5. Apparatus according to claim 4, in which the spacer rod is affixed to the outside wall and to the back plate.

6. Apparatus according to claim 5, which includes a compression rod disposed in axial prolongation of the spacer rod between back plate and outside wall.

7. Apparatus according to claim 6, in which the compression rod is affixed to the outside wall.

8. Apparatus according to claim 3, in which the spacer rod is provided in the center of a surface of the walls.

9. Apparatus according to claim 3, in which a back plate is provided with at least one bore.

10. Apparatus according to claim 9, in which at last one spacer rod is provided with a longitudinally displaceable pressure rod.

11. Apparatus according to claim 9, in which the spacer rod is brought through the bore of the plate.

12. Apparatus according to claim 10, in which the rod and the piston are supportable against the outside walls.

* * * * *